United States Patent
Yun et al.

(10) Patent No.: US 10,743,421 B2
(45) Date of Patent: Aug. 11, 2020

(54) MIXING DIMERS FOR MOISTURE RESISTANT MATERIALS

(71) Applicant: HZO, Inc., Draper, UT (US)

(72) Inventors: Yang Yun, Draper, UT (US); Tining Su, Draper, UT (US)

( * ) Notice: Subject to any disclaimer, the term of this patent is extended or adjusted under 35 U.S.C. 154(b) by 60 days.

(21) Appl. No.: 15/627,274

(22) Filed: Jun. 19, 2017

(65) Prior Publication Data

US 2017/0362703 A1 Dec. 21, 2017

Related U.S. Application Data

(60) Provisional application No. 62/351,647, filed on Jun. 17, 2016.

(51) Int. Cl.
*B05D 1/00* (2006.01)
*H05K 3/28* (2006.01)
*B05D 1/34* (2006.01)

(52) U.S. Cl.
CPC .............. *H05K 3/285* (2013.01); *B05D 1/34* (2013.01); *B05D 1/60* (2013.01); *H05K 2203/088* (2013.01); *H05K 2203/1173* (2013.01)

(58) Field of Classification Search
CPC ........................................... B05D 1/60
See application file for complete search history.

(56) References Cited

U.S. PATENT DOCUMENTS

| | | | |
|---|---|---|---|
| 8,518,487 B2 * | 8/2013 | Lai | C23C 16/452 427/255.6 |
| 2011/0293832 A1 * | 12/2011 | Gersdorff | B05D 1/60 427/255.28 |
| 2012/0145215 A1 * | 6/2012 | Hwang | C23C 16/4488 136/232 |
| 2013/0177699 A1 * | 7/2013 | Stevens | B05D 1/60 427/8 |

* cited by examiner

*Primary Examiner* — Elizabeth A Burkhart
(74) *Attorney, Agent, or Firm* — Intellectual Strategies

(57) ABSTRACT

A coating apparatus includes a first vaporizer configured to vaporize a first precursor material, a second vaporizer configured to vaporize a second precursor material in series with the first vaporizer, at least one pyrolysis chamber configured to further process vaporized precursor material from one of the first vaporizer or second vaporizer, and a deposition chamber configured to receive the processed precursor materials.

7 Claims, 10 Drawing Sheets

MIXING DIMERS FOR MOISTURE RESISTANT MATERIALS

RELATED APPLICATIONS

This application claims priority to U.S. provisional application 62/351,647 entitled "Mixing Dimers for Moisture-Resistant Materials" and filed on 17 Jun. 2016. The above application is incorporated herein by reference in its entirety.

BACKGROUND

This disclosure relates generally to the use of different types of moisture-resistant materials in a mixture. More specifically, this disclosure relates to protective coatings formed from a mixture of precursors that include two or more types of dimers, and to moisture-sensitive substrates coated with such protective coatings.

SUMMARY

The subject matter of the present application has been developed in response to the present state of the art, and in particular, in response to the problems and disadvantages associated with conventional protective coatings that have not yet been fully solved by currently available techniques. Accordingly, the subject matter of the present application has been developed to provide embodiments of a system, an apparatus, and a method that overcome at least some of the shortcomings of prior art techniques.

Embodiments of a coating apparatus are disclosed. In one embodiment, the coating apparatus includes a first vaporizer configured to vaporize a first precursor material, a second vaporizer configured to vaporize a second precursor material in series with the first vaporizer, at least one pyrolysis chamber configured to further process vaporized precursor material from one of the first vaporizer or second vaporizer, and a deposition chamber configured to receive the processed precursor materials.

In some embodiments, the at least one pyrolysis chamber includes a first pyrolysis chamber and a second pyrolysis chamber in series with the second pyrolysis chamber.

In some embodiments, the coating apparatus further includes a first conduit from the first vaporizer to the first pyrolysis chamber and a second conduit from the second vaporizer to the second pyrolysis chamber.

In some embodiments, the coating apparatus further includes a third conduit from the first pyrolysis chamber to the deposition chamber and a fourth conduit from the second pyrolysis chamber to the deposition chamber.

In some embodiments, the coating apparatus further includes a third conduit extending from the first pyrolysis chamber and the second pyrolysis chamber to the deposition chamber, the third conduit configured to mix the processed first precursor material and the processed second precursor material prior to entering the deposition chamber.

In some embodiments, the first precursor material includes parylene C, and the second precursor material includes parylene F.

In some embodiments, the coating apparatus further includes a first conduit extending from the first vaporizer and the second vaporizer to the at least one pyrolysis chamber, the third conduit configured to mix the vaporized first precursor material and the vaporized second precursor material prior to entering the at least one pyrolysis chamber.

Embodiments of a coating for imparting a substrate with moisture resistance are disclosed. In one embodiment, the coating includes a copolymer. The copolymer includes a mixture of a first moisture resistant material including parylene C and a second moisture resistant material including parylene F.

In some embodiments, the copolymer is moisture-impermeable. In some embodiments, the copolymer includes more than one poly(p-xylylene) polymer. In some embodiments, the copolymer is impermeable to ultraviolet light.

In some implementations, the copolymer includes a fluoropolymer. In one implementation the copolymer includes a fluorinated poly(p-xylylene) polymer. In one implementation the copolymer includes a hydrophobic material. In one implementation the copolymer includes a material or structure with an electronegative property. In one implementation the copolymer includes a material or structure with moisture-repellant features.

In some embodiments, the first moisture resistant material including parylene C is distributed evenly within the second moisture resistant material including parylene F.

In some implementations, the copolymer further includes a third moisture resistant material.

Embodiments of a method for imparting an electronic component with moisture resistance are disclosed. In one embodiment, the method includes loading a first precursor material into a first vaporizer, loading a second precursor material into a second vaporizer, vaporizing the first and second precursor separately, and applying a copolymer including the first precursor material and the second precursor material onto at least a portion of an electronic device, the copolymer providing a type of moisture resistance.

In some embodiments, the first precursor material includes a parylene C dimer and the second precursor material includes a parylene F dimer.

In some embodiments, the method further includes processing the first precursor material and the second precursor material in separate pyrolysis chambers.

In some embodiments, the method includes mixing the processed first precursor material and the processed second precursor material, and further feeding the mixture into a deposition chamber.

In some embodiments, the method includes feeding the processed first precursor material a deposition chamber and feeding the processed second precursor material into the deposition chamber separately from the processed first precursor material.

In some embodiments, the method further includes mixing the vaporized first precursor material and the vaporized second precursor material and feeding the mixture of the vaporized first precursor material and the vaporized second precursor material into a single pyrolysis chamber to further process the mixture of the vaporized first precursor material and the vaporized second precursor material into the copolymer.

In some embodiments, the method further includes feeding the copolymer into a deposition chamber to apply the copolymer.

Embodiments of a method for depositing a protective coating on an electronic device are disclosed. In one embodiment, the method includes mixing a first precursor material and a second precursor material to form a precursor mixture, loading the precursor mixture into a vaporization vessel, at least partially vaporizing the precursor mixture of the first precursor material and second precursor material into a first copolymer, and applying the first copolymer onto at least a portion of an electronic device.

In some embodiments, the first copolymer provides moisture resistance and ultraviolet protection. In some embodiments, the first copolymer includes a mixture of parylene C and parylene F. In some embodiments, the first precursor material includes a parylene C dimer. In some embodiments, the second precursor material includes a parylene F dimer.

In some embodiments, the method further includes mixing a third precursor material into the precursor mixture.

Embodiments of a coating apparatus are disclosed. In one embodiment, a coating apparatus includes a first vaporizer configured to vaporize a first precursor material including parylene C, a second vaporizer configured to vaporize a second precursor material including parylene F, the second vaporizer in series with the first vaporizer. The coating apparatus further includes a first pyrolysis chamber, the first pyrolysis chamber configured to pyrolyze the vaporized first precursor material and a first conduit extending from the first vaporizer to the first pyrolysis chamber, the first conduit configured to transport the vaporized first precursor material to the first pyrolysis chamber.

The coating apparatus further includes a second pyrolysis chamber in series with the first pyrolysis chamber, the second pyrolysis chamber configured to pyrolyze the vaporized second precursor material and a second conduit extending from the second vaporizer to the second pyrolysis chamber, the second conduit configured to transport vaporized second precursor material to the second pyrolysis chamber. The coating apparatus further includes a deposition chamber configured to receive the processed precursor materials and a third conduit extending from the first pyrolysis chamber and the second pyrolysis chamber to a deposition chamber, the third conduit configured to mix the processed first precursor material and the processed second precursor material prior to entering the deposition chamber. The coating apparatus further includes the deposition chamber wherein the deposition chamber is configured to receive the processed precursor materials.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which.

DETAILED DESCRIPTION

Figure 1:
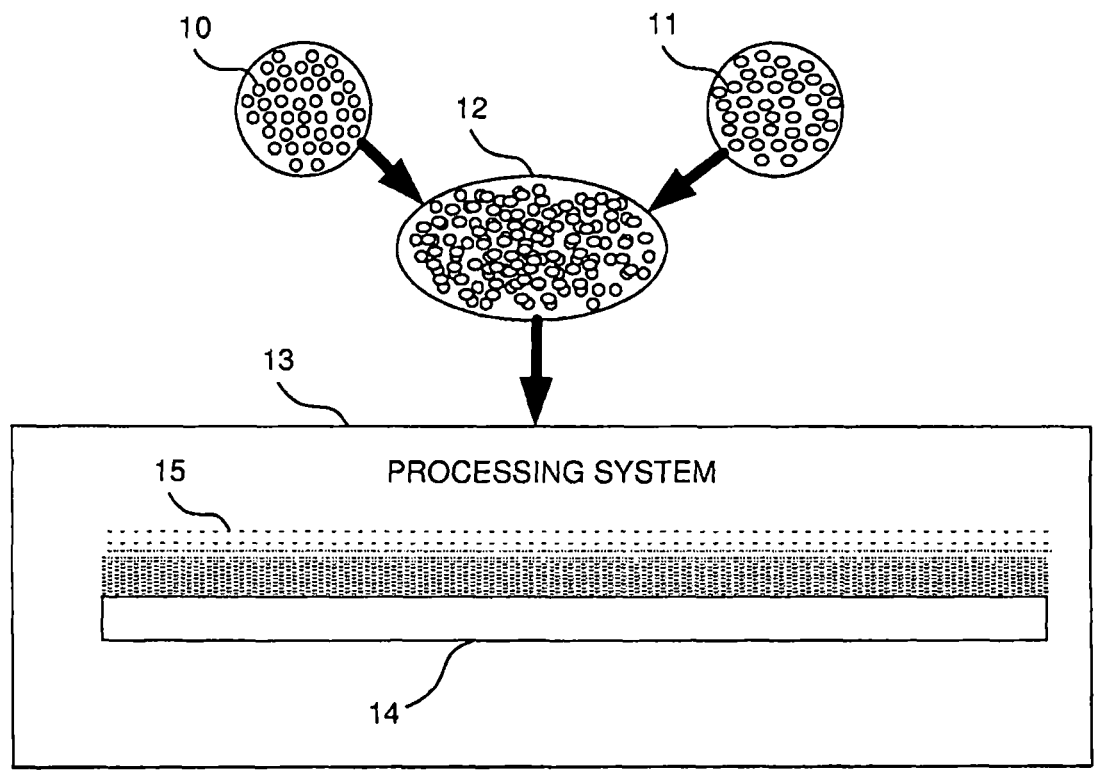
FIG. 1 is a schematic diagram of a system for forming a coating from a mixture of precursors that include two or more types of dimers, according to one or more embodiments of the present disclosure.

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments As used herein, the terms "moisture-resistant" and "moisture-resistance" refer to the ability of a coating to prevent exposure of a coated element or feature to moisture. As an example, a moisture-resistant coating may resist wetting or penetration by one or more types of moisture, or it may be impermeable to one or more types of moisture or substantially impermeable to one or more types of moisture. The term "substantially impermeable" indicates that over long durations of time, some moisture may migrate through the coating. Long durations of time may refer to periods of 5 years, 10 years, 15 years, or 20 years. When subjected to temperatures below 100° C., a long duration of time may refer to 20 years. "Moisture-resistant" may be defined, in some cases, as having a water vapor transmission less than 0.25 g-mil/100 in$^2$-day (at 38° C. and 90% relative humidity). Both moisture-impermeable and substantially moisture-impermeable barriers are, for the sake of simplicity, referred to herein as "moisture impermeable" barriers. A moisture-resistant coating may repel one or more types of moisture. For example, a moisture-resistant coating may have an outer surface that is configured (e.g., structurally (e.g., lotus leaf-type structures, etc.), chemically (e.g., hydrophobic materials, etc.), etc.) to repel moisture.

In some embodiments, a moisture-resistant coating may be impermeable to, substantially impermeable to, and/or repel water, an aqueous solution (e.g., salt solutions, acidic solutions, basic solutions, drinks, etc.) or vapors of water or other aqueous materials (e.g., humidity, fogs, mists, etc.), wetness, etc.). The terms "moisture-resistant" and "moisture-resistance" may also refer to the ability of a coating to restrict permeation of or repel organic liquids or vapors (e.g., organic solvents, other organic materials in liquid or vapor form, etc.), as well as a variety of other substances, corrosive materials, or conditions that might damage a substrate (e.g., a moisture-sensitive substrate, etc.), such as an electronic device or its components.

In one aspect, this disclosure relates to protective coatings. A protective coating according to this disclosure may include a mixture of two or more different types of moisture-resistant materials, or two or more similar moisture-resistant materials with different properties (e.g. microbial resistance, UV resistance, etc.). The coating may provide moisture resistance to a substrate on which the coating is applied. In some embodiments, the coating includes a base portion providing a mixture of a first type of moisture resistance that utilizes parylene C and a second type of protection that utilizes parylene F. The base portion may be moisture impermeable. The base portion may include a poly(p-xylylene) polymer. The base portion may be resistant to transmission of ultraviolet light. In some embodiments, the base portion includes a fluoropolymer.

Methods for forming such a protective coating are also disclosed. Such a method may include depositing a mixture of two precursors into a vaporizer vessel, vaporizing the mixture into a copolymer, and applying the copolymer to at least a portion of an electronic component. The copolymer provides a type of moisture resistance to the portions of the electronic component. The two precursors may include a parylene C dimer and a parylene F dimer.

According to another aspect, a substrate may include at least one protective coating that includes a mixture of two or more different moisture-resistant materials. In embodiments where the first type of moisture-resistance includes impermeability to moisture and the second type of moisture-resistance includes moisture-repellence, the dimers of each are mixed prior to placement in a vaporizer vessel.

Embodiments of moisture-resistant protection, as described herein, may be particularly useful for protecting state of the art mobile electronic devices from accidental or incidental exposure to moisture. One precursor may provide the primary type of moisture-resistance (e.g., a moisture-impermeable coating or barrier that covers and seals or substantially seals at least some moisture-sensitive components or other features within the interior of an electronic device in a manner that will prevent moisture from contacting those components or other features, should moisture enter into the interior of the electronic device. Coatings, in some instances, may have a detrimental effect on the performance or even the operation of some components of an electronic device (e.g., microphones, speakers, optical elements, etc.). Nonetheless, these components and/or the electronic device(s) of which they form a part may benefit from moisture resistance (e.g., by preventing moisture from entering into the interior of such a component, into the interior of the electronic device of which the component is a part, etc.).

The secondary type of moisture resistance provided by the coating may result from the second precursor. The secondary type of moisture resistance may not provide the same degree of resistance to moisture as the primary type of moisture resistance. Some embodiments of the coating may be configured to enable electrical communication therethrough. For example, the coating may be electrically conductive or it may be too thin to prevent electricity from passing therethrough. In other embodiments, the thickness (or thinness) of the coating may enable ready removal of the coating from electrically conductive features (e.g., communication ports, contacts, etc.) to expose the same and, thus, to facilitate electrical connections to the exposed electrically conductive features.

In other various embodiments, the substrate may include an industrial device, a vehicular device, a precision mechanical device, a medical device, a scientific instrument, an article of clothing or the like.

Some components or features of a moisture-sensitive substrate, such as an electronic device, may lack a moisture-resistant coating or barrier. These components or features may include, but are not limited to, surfaces of components and/or features exposed to an exterior of the moisture-sensitive substrate, as well as components and/or features located within an interior of the moisture-sensitive substrate.

Other aspects, as well as features and advantages of various aspects, of the disclosed subject matter will be apparent to those of ordinary skill in the art through consideration of this disclosure and the appended claims.

FIG. 1 is a schematic diagram of an embodiment of a system for forming a coating from a mixture of precursors that include two or more types of dimers. The illustrated embodiment includes a first precursor 10 and a second precursor 11. The first precursor 10 and the second precursor 11 are mixed to form a precursor mixture 12. The first precursor 10 may be parylene C (poly(chloro-p-xylylene)) which may have a superior moisture barrier than other known parylenes. The second precursor 11 may be parylene F (sometimes known as parylene AF-4 (poly($\alpha,\alpha,\alpha',\alpha'$-tetrafluoro-p-xylylene)) or parylene VT-4 (poly(tetrafluorop-xylylene))), with all four fluorine groups on the aromatic ring) which may include properties that include protection from ultraviolet (UV) light. In certain implementations, reference to parylene F can specifically refer to parylene-VT4, parylene-AF4, or any other parylene with a fluorine atom or atoms in the molecular structure.

In some embodiments, the precursor mixture 12 may include a mixture of more than two precursors including more than two types of dimers. In some embodiments, the precursor mixture 12 may include a mixture of three precursors including parylene C, parylene F, and parylene VT-4.

The processing system 13, which processes the precursor mixture 12 and applies a protective coating to a substrate, is briefly discussed. The processing system may include fewer or more features that perform fewer or more functions as described herein. In one embodiment, the processing system 13 includes means for maintaining a pressure (e.g., a negative pressure, or vacuum, etc.) within the processing system 13. The processing system 13 may further include various chambers, such as an evaporation chamber, a pyrolysis chamber, a deposition chamber, etc. in which various processing steps convert the precursor mixture into a copolymer 15, which is deposited upon a substrate or electronic device. In one non-limiting example, a processing system includes an evaporation chamber configured to receive the precursor mixture (such as parylene C dimer and parylene F dimers) from a receptacle. A pyrolysis chamber may be located downstream from the evaporation chamber and a deposition chamber may be located downstream from the pyrolysis chamber. One or more of the chambers may communicate with a vacuum pump and other elements that may facilitate polymerization and the deposition of the copolymer onto a substrate. One or more valves may also control the flow of materials through the processing system and onto the substrate.

Figure 3:
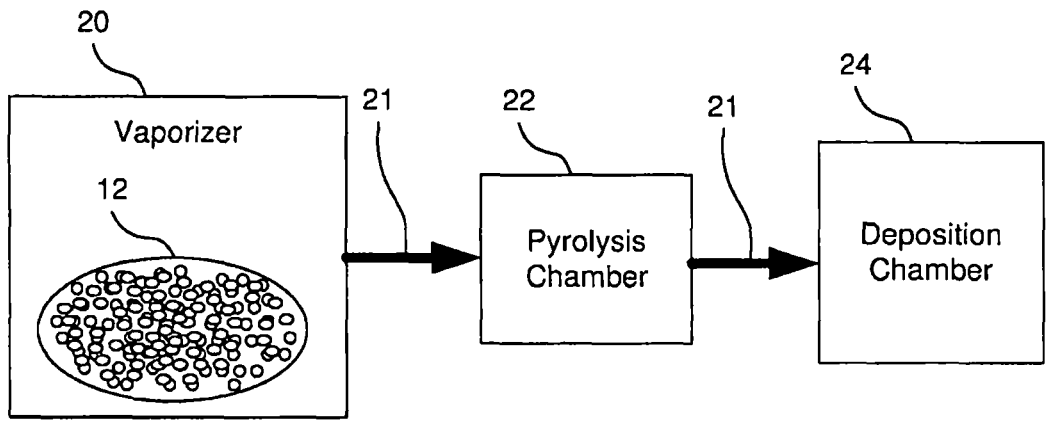
FIG. 3 is a schematic diagram of a processing system, according to one or more embodiments of the present disclosure.

Referring to FIG. 3, the first precursor 10 and the second precursor 11 may be mixed together and put into a common vaporizer 20 for processing through a processing system. If the rate of vaporization of the first precursor 10 varies from the rate of vaporization of the second precursor 11, the copolymer 15 formed may result in gradation of concentration of each monomer of the copolymer 15. For example, the first precursor 10 may vaporize faster than the second precursor 11 and result in a higher concentration of the monomer of the first precursor 10 next to the substrate and a smaller concentration of the monomer of the first precursor 10 through the thickness of the coating 18.

Figure 4:
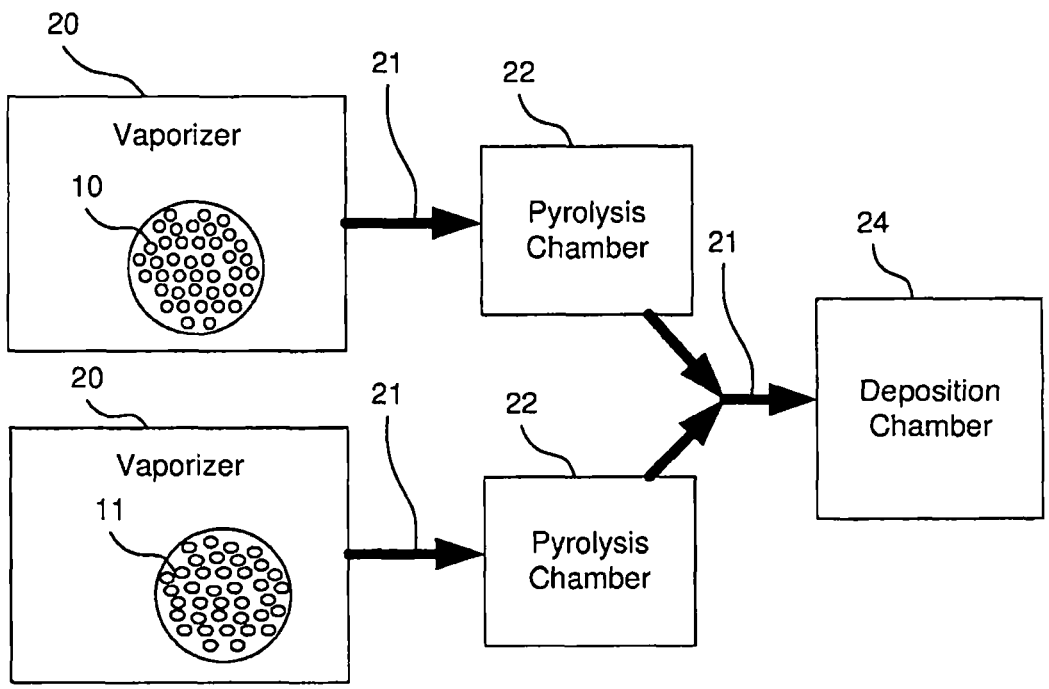
FIG. 4 is a schematic diagram of a processing system including more than one vaporizer and more than one pyrolysis chamber that feed into a single deposition chamber, according to one or more embodiments of the present disclosure.

Referring to FIG. 4, a coating apparatus is depicted. In the depicted embodiment, the first precursor 10 and the second precursor 11 may remain unmixed and processed in separate vaporizers 20 and separate pyrolysis chambers 22. The vaporizers 20 and pyrolysis chambers 22 are in series with each other. In such embodiments, the mixing may occur just prior to entering the deposition chamber 24. In such embodiments, the separate vaporizers 20 and separate pyrolysis chambers 22 may be specially configured for the particular precursor being processed and may result in a more uniform concentration of the resulting copolymer 15.

In addition to the embodiments disclosed with reference to FIGS. 3 and 4, embodiments may mix the precursors at any of a number of stages within the processing system including prior to the pyrolysis chamber 22 or within deposition chamber 24. For example, in some embodiments, after the vaporizers 20 and prior to the pyrolysis chamber 22, the vaporized precursor materials may be mixed. In another embodiment, the processed precursor materials may be mixed between the pyrolysis chambers 22 and the deposition chamber 24 (as depicted in FIG. 4. In some embodiments, the processed precursor materials are separately fed to the deposition chamber 24 at different locations in the deposition chamber 24. In some embodiments, the processed precursor materials may be fed at different rates and staggered in time. Such flows may be controlled by valves which regulate the flow of the processed precursor materials into the deposition chamber 24.

The coating apparatuses may include conduits 21 which are configured to transport the processed materials from chamber to chamber. For example, a first conduit 21 may extend from the first vaporizer 20 to the first pyrolysis chamber 22 and a second conduit 21 may extend from the second vaporizer 20 to the second pyrolysis chamber 22. This allows the precursor materials to be processed separately. A third conduit 21 may extend from the first pyrolysis chamber and the second pyrolysis chamber to the deposition chamber. The third conduit 21 may be configured to mix the processed first precursor material and the processed second precursor material prior to entering the deposition chamber. In another embodiment, the processed first precursor material and the processed second precursor material are separately fed to the deposition chamber and mix within the deposition chamber. In another embodiment, the mixture occurs prior to the pyrolysis chamber. That is, a conduit 21 extends from the first vaporizer and the second vaporizer to a pyrolysis chamber. Various configurations are envisioned within the scope of the embodiments described herein. The conduits 21 described herein may include valves which regulate the amount and speed with which processed materials mix or transport from one component to another.

The processed precursor materials are formed into a copolymer and applied to the substrates within the deposition chamber 24. Regardless of the stage at which the precursors mix, the resulting material is a copolymer 15 that is formed on the substrate 14.

It will be appreciated that multiple types of parylene dimers may be mixed and used to create the protective coating 18. Other possible parylenes may be used (e.g., parylene N, or poly(p-xylylene); parylene D, or poly(dichloro-p-xylylene); parylene A (amino-modified parylene)). In some embodiments, the combination of dimers can include parylene F plus one or more of the following: parylene C, parylene N, and/or parylene D, individually or in any combination. Once deposited onto the substrate 14, the coating may have any of various thicknesses, including, for example, between about 0.5 microns and 25 microns.

In one embodiment, a portion of the protective coating 18 may impart the protective coating 18 with at least one desired characteristic (e.g., thermal conductivity, electrical insulation, UV protection, adhesion, hydrophobicity, hydrophilicity, a desired texture, a desired surface finish, etc.).

In some embodiments, the copolymer 15 includes a mixture of moisture-resistant materials. As an example, the copolymer 15 may be a mixture of Parylene C and Parylene F, which may be substantially impermeable to water or impermeable to water. In addition to providing moisture-resistance, the copolymer 15 may be moisture-impermeable. In a specific embodiment, the copolymer 15 is a mixture of parylene C (as previously disclosed herein), which is a poly(p-xylylene) in which some hydrogens have been replaced with chlorine, and parylene F with some fluorine substitutions. The fluorine substitutions of such an embodiment may impart the protective coating with added moisture repellence.

In some embodiments, the mixture of parylene C and parylene F may provide different types of moisture-resistance depending on the ratio of the precursor dimers in the precursor mixture 12. In some embodiments, the ratio of dimers may be 1:1. In other embodiments, the ratio of dimers may include more of one dimer than the other. The ratio of dimers may affect the properties of the copolymer 15. For example, a ratio that includes more parylene C dimer than parylene F dimer may result in a coating 18 that has more parylene C type properties than parylene F type properties. Conversely, a ratio including more parylene F dimer than parylene C dimer may result in a coating 18 that has more parylene F type properties than parylene C type properties. Various ratios are envisioned within the scope of this disclosure.

Figure 5:
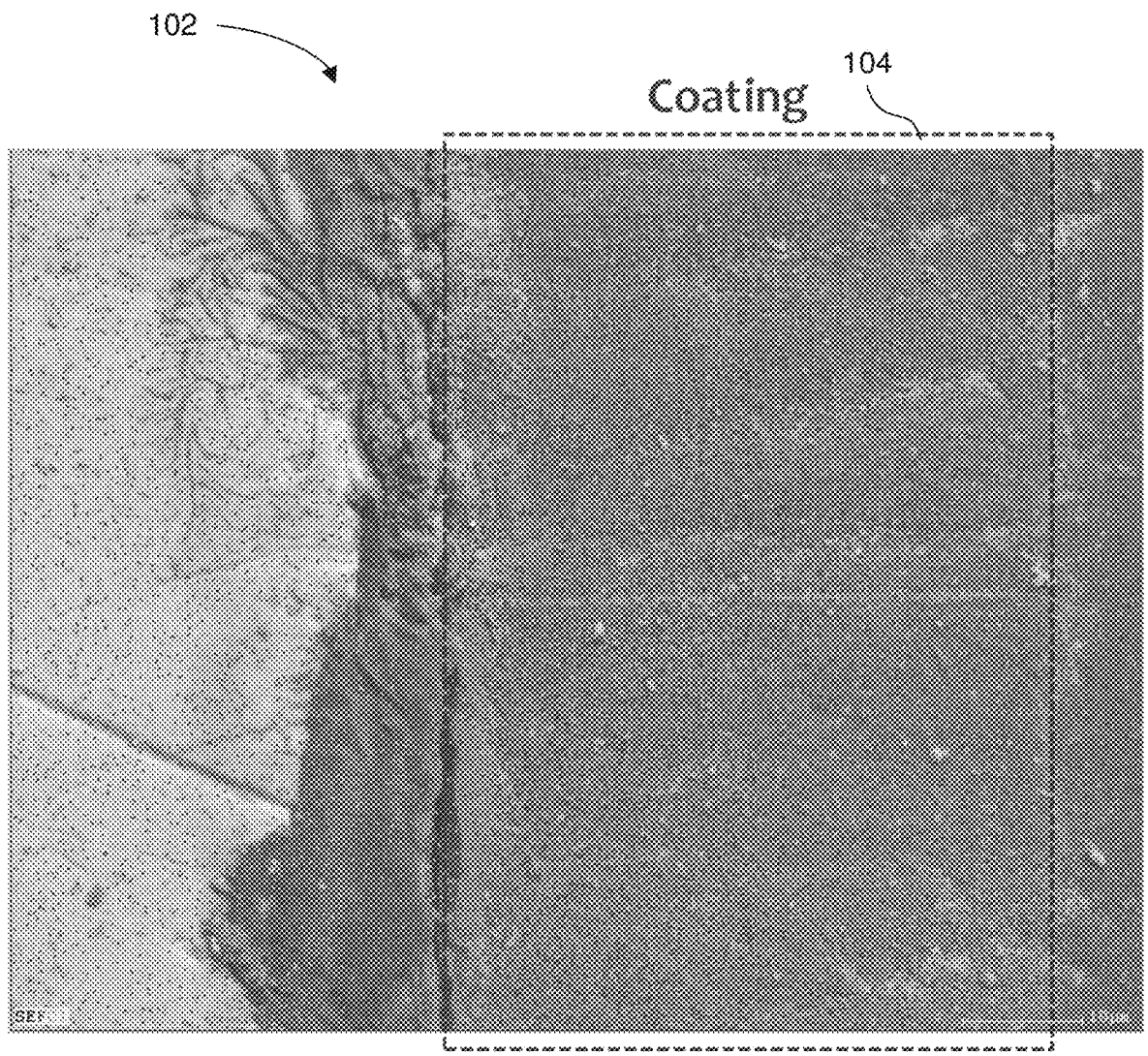
FIG. 5 depicts the results of Scanning Electron Microscopy with Energy Dispersive X-ray Spectroscopic Analysis performed on a ratio of 10% parylene F and 90% parylene C, according to one or more embodiments of the present disclosure.
Figure 6:
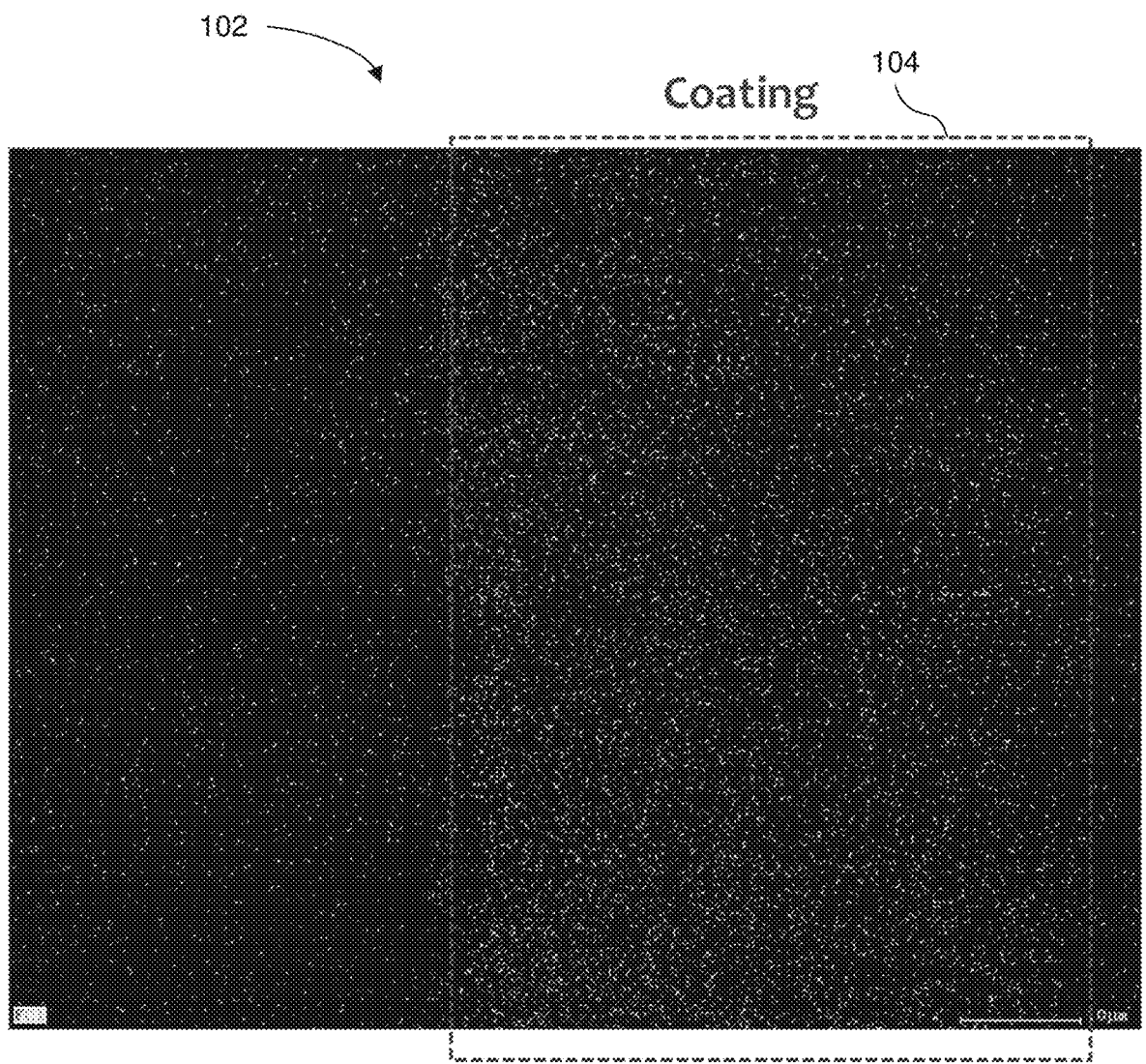
FIG. 6 depicts the results of Scanning Electron Microscopy with Energy Dispersive X-ray Spectroscopic Analysis performed on a ratio of 10% parylene F and 90% parylene C, according to one or more embodiments of the present disclosure.

FIGS. 5-10 depict the results of Scanning Electron Microscopy with Energy Dispersive X-ray Spectroscopic Analysis ("SEM-EDS") performed on three ratios of parylene F and parylene C. FIGS. 5 and 6 depict the results of SEM-EDS analysis on a ratio of 10% parylene F and 90% parylene C. The results 102 are show with the parylene F depicted as red dots and the parylene C depicted as green dots. The coating area is depicted by the dashed rectangle 104.

Figure 7:
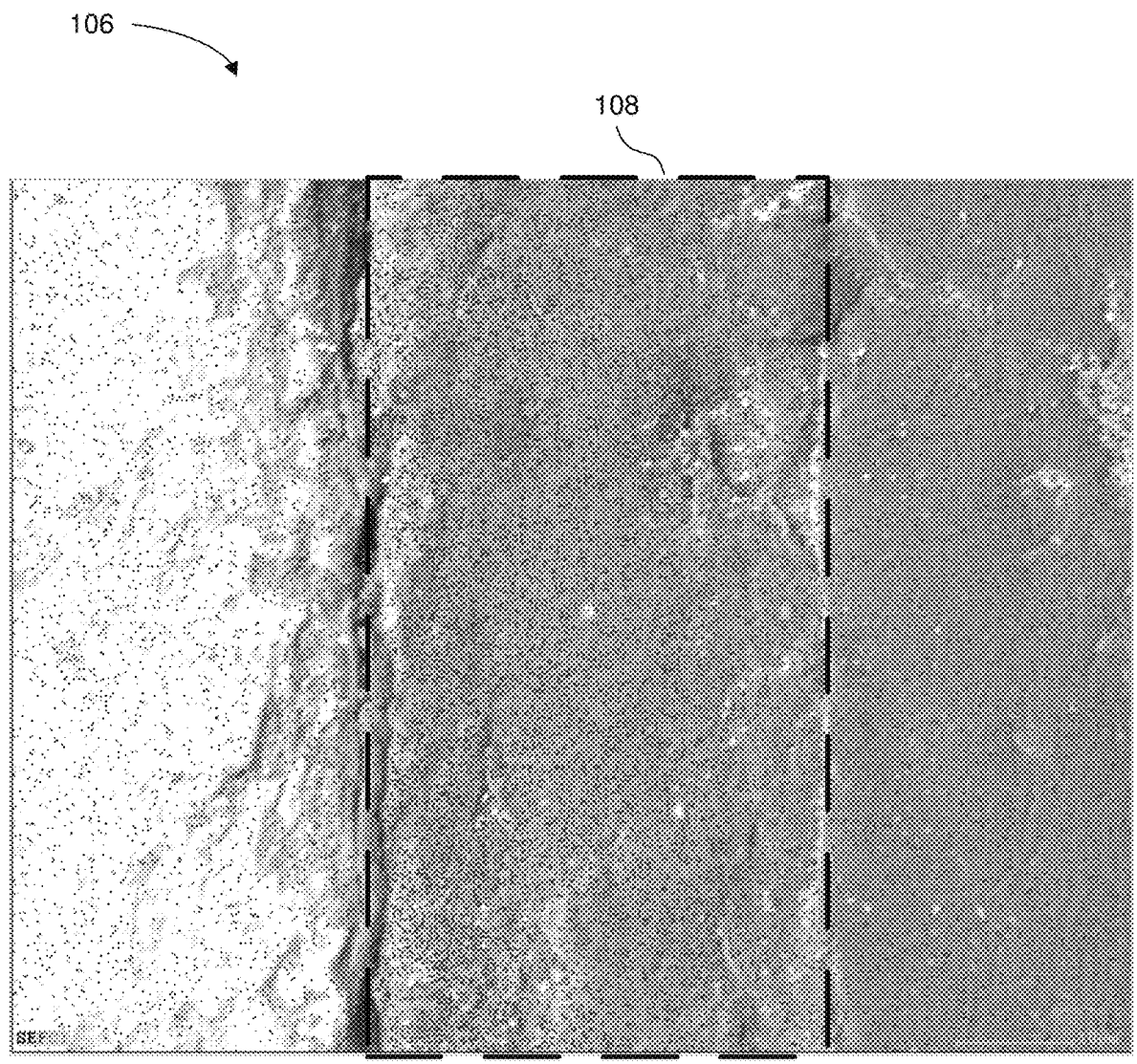
FIG. 7 depicts the results of Scanning Electron Microscopy with Energy Dispersive X-ray Spectroscopic Analysis performed on a ratio of 25% parylene F and 75% parylene C, according to one or more embodiments of the present disclosure.
Figure 8:
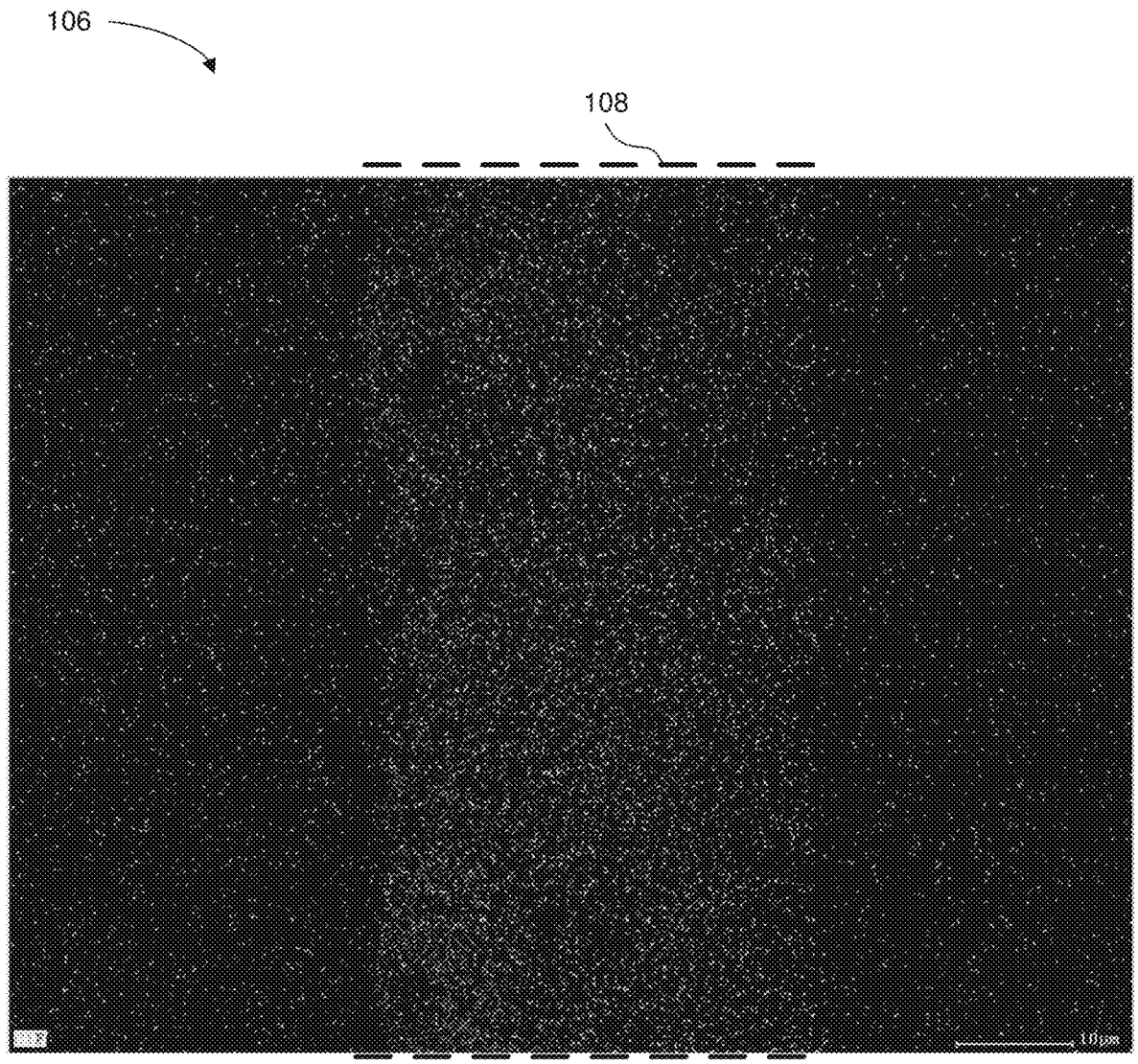
FIG. 8 depicts the results of Scanning Electron Microscopy with Energy Dispersive X-ray Spectroscopic Analysis performed on a ratio of 25% parylene F and 75% parylene C, according to one or more embodiments of the present disclosure.

FIGS. 7 and 8 depict the results 106 of SEM-EDS analysis on a ratio of 25% parylene F and 75% parylene C. The results 106 are show with the parylene F depicted as red dots and the parylene C depicted as green dots. The coating area is depicted by the dashed rectangle 108.

Figure 9:
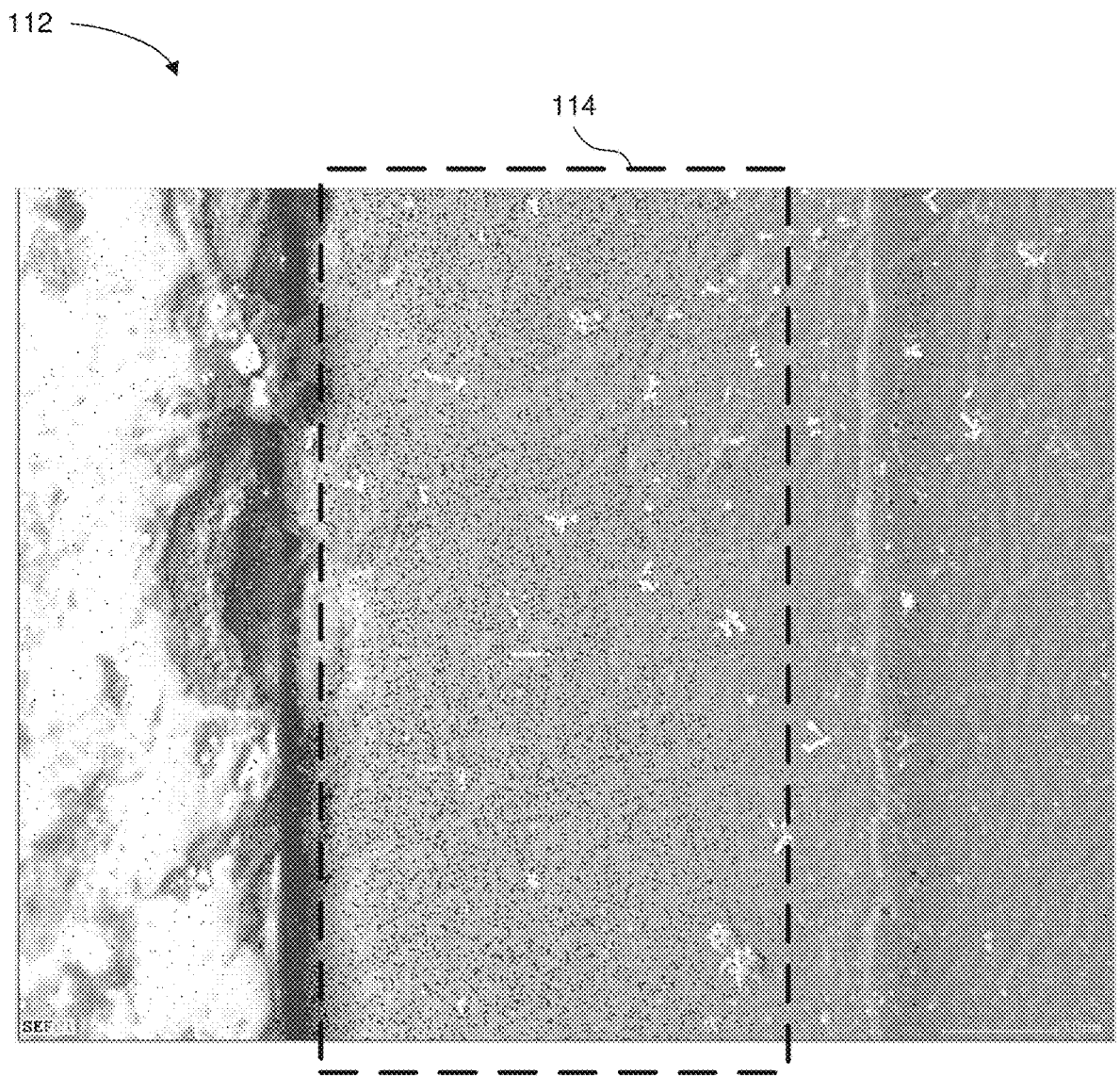
FIG. 9 depicts the results of Scanning Electron Microscopy with Energy Dispersive X-ray Spectroscopic Analysis performed on a ratio of 50% parylene F and 50% parylene C, according to one or more embodiments of the present disclosure.
Figure 10:
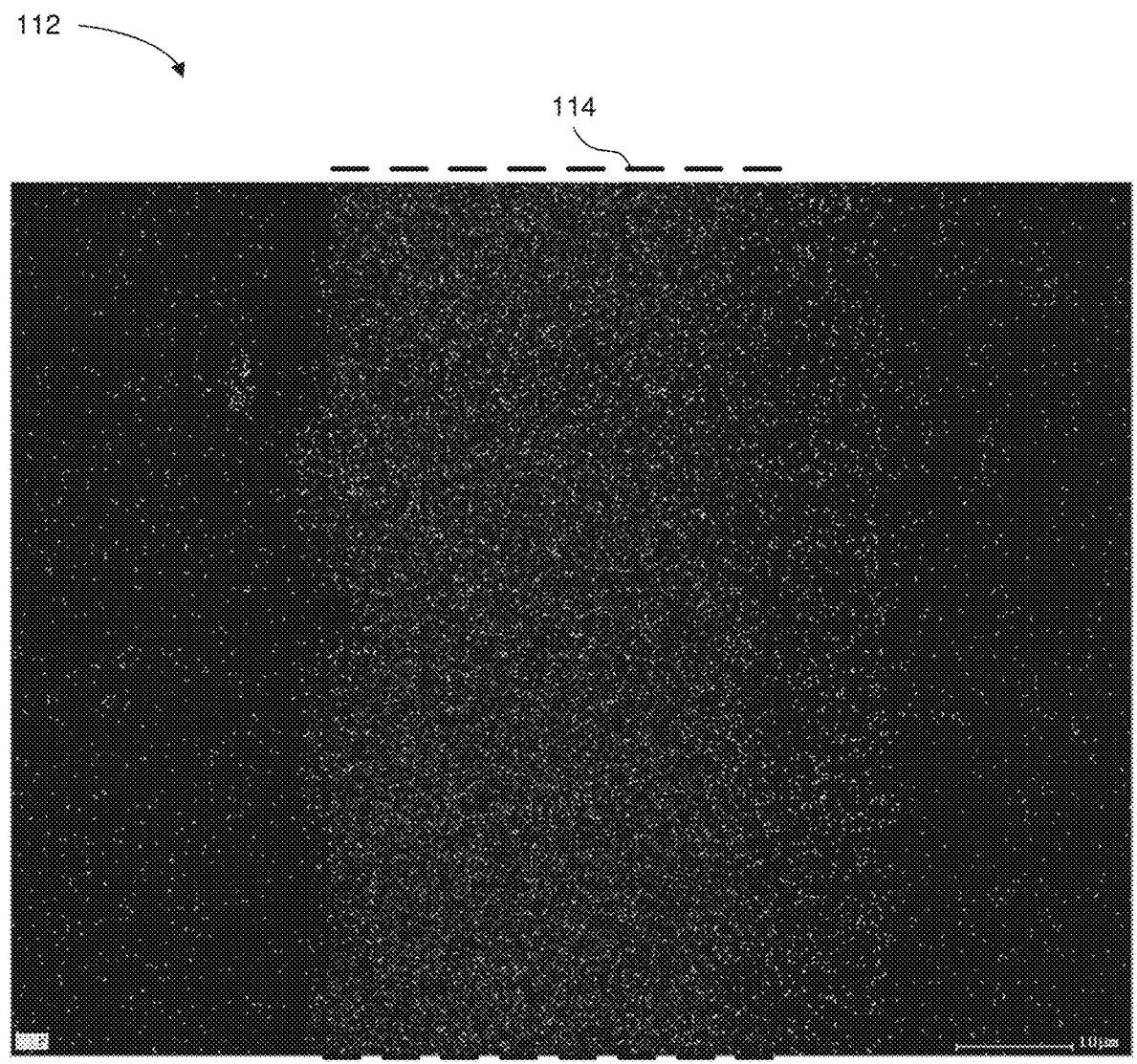
FIG. 10 depicts the results of Scanning Electron Microscopy with Energy Dispersive X-ray Spectroscopic Analysis performed on a ratio of 50% parylene F and 50% parylene C, according to one or more embodiments of the present disclosure.

FIGS. 9 and 10 depict the results 112 of SEM-EDS analysis on a ratio of 50% parylene F and 50% parylene C. The results 112 show the dispersion of parylene F (depicted as red dots) and parylene C (depicted as greed dots) in the copolymer 15. The coating area is depicted by the dashed rectangle 114. As is depicted in the results, the resulting coating 18 is a copolymer 15, where the mix of molecules is relatively uniform throughout the coating 18 (with a small gradient through the thickness of the coating). As the percentage of parylene F is increased the distribution of parylene F within the parylene C increases.

In some embodiments, a concentration gradation may be desirable to achieve a different insulating profile. For example, a higher concentration of parylene F may be desired near the exposed surface of a coating 18 to provide thermal stability or superior UV protection. Various concentration gradations are envisioned within the scope of this disclosure.

In a specific embodiment, the primary type of protection of the coating 18 may include moisture-impermeability. Such a coating 18 may have a thickness corresponding with a desired amount of impermeability to moisture. In some embodiments, the coating formed may have a thickness of about 1 μm (micrometer, or micron) to about 25 μm. A secondary type of protection may be moisture repellence which may be achieved through the parylene F portion of the mixture. By adjusting the ratio of the precursor mixture 12 the primary and secondary type of protection may be adjusted.

As a specific, but non-limiting, example of the foregoing, the copolymer 15 may be a mixture of parylene C and a fluorinated polymer, or "fluoropolymer." Although the preceding examples are specific, a variety of embodiments of moisture-impermeable materials may be used in a protective coating according to this disclosure.

In some embodiments, a hydrophobic or moisture-repellent portion of a coating may comprise a fluorinated material. Examples of suitable fluorinated materials include fluorinated parylenes (e.g., parylene AF-4, etc.), other fluorinated polymers (e.g., polytetrafluoroethylene (PTFE) (or TEFLON®), etc.), a halogenated (e.g., fluorinated, etc.) polymer of the type disclosed by U.S. Reissued Pat. RE43, 651 and the like. Some embodiments of the hydrophobic or moisture repellent portion of a coating may include a hydrophobic or superhydrophobic material with a rough (e.g., microstructured, nanostructured, etc.) surface.

In one embodiment, the protective coating 18 may include a material that promotes adhesion of the protective coating 18 or a portion thereof to a substrate 14. Such an adhesion-promoting material may be selected on the basis of its ability to adhere to the structures between which the adhesion promote resides (i.e., the substrate and a base portion of the protective coating, etc.). A variety of materials may be used to enhance adhesion and/or for any of a variety of other purposes, including, without limitation, ceramic materials, such as aluminum oxide ($Al_2O_3$), which is also commonly referred to as "alumina," boron nitride, or any of a variety of other materials.

Some embodiments include capping materials that may be used as an outermost material of a protective coating, and may include aluminum oxide, diamond-like carbon (e.g., pure carbon, hydrogenated carbon, fluorinated carbon, nitrogenized carbon, phosphorylated carbon, etc., or combinations of any of the foregoing), silicon nitride, a metal oxide such as hafnium (IV) oxide ($HfO_2$), yttrium oxide ($Y_2O_3$) or zirconium dioxide ($ZrO_2$), or the like. As indicated herein, such a material may harden or toughen the surface of a protective coating, cover passageways through another material, or otherwise enhance the functionality, durability (e.g., hardness, impact resistance, scratch resistance, abrasion resistance, wear resistance, etc.), etc., of the protective coating.

In some embodiments, a plurality of different types of protective coatings may cover different areas of a substrate. An electronic device (e.g., a mobile electronic device, such as a smart phone, a tablet computing device, a digital media player, etc.) may include a printed circuit board that carries various components. In some embodiments, a protective coating that includes a particular ratio of a precursor mixture may cover some areas of the substrate, such as particular components, as well as a portion of the printed circuit board located therebetween. In the same embodiments, a protective coating 18 with a different ratio of precursor materials may coat another of the components of the substrate, while another protective coating that includes another ratio of precursor materials may coat yet another component.

In a more specific embodiment, a coating 18 may include a particular ratio of parylene C and parylene F, and may be used to protect moisture-sensitive components whose operation may remain substantially unimpeded by a coating of such a mixture. A second ratio of parylene C and parylene F may impart a moisture-repellant property and may be applied over other areas such as more moisture-sensitive components. In addition, such a mixture may be applied directly to certain components that will benefit from moisture resistance of such a ratio, but whose operation would be impeded by a coating of a different ratio. Examples of such components include, but are not limited to, microphones, speakers, optical elements, and the like. Of course, a substrate may include any combination of protective coatings. The immediately preceding disclosure should not be considered to limit the manner in which different ratios may be combined.

The protective coating(s) may be confined or substantially confined to components within the interior of an electronic device, such as within the interior of the housing or other external components of an electronic device. In other embodiments, a protective coating may cover at least some components that are exposed to the outside of the electronic device.

Methods for applying protective coatings 18 to a substrate 14 are also disclosed. The precursor mixture 12 may be a mixture of parylene C and parylene F dimers and may be applied in a single process. When a single process is used to apply the mixture, the protective coating 18 may be applied much quicker than applying two separate coatings in two processes. Such a method includes one process in which the precursor mixture 12 is applied as a copolymer 15 to form a coating 18 on a substrate 14.

With regard to the process of depositing a copolymer 15 resulting from the mixture of dimers, including parylene C and parylene F dimers, various methods may be used. The precursors (or dimers) are mixed together and loaded or filled into a vaporizer itself or a vaporizer vessel which then may be deposited on substrates using machinery and known processes.

In some embodiments, a coating method may also include the application of a mask to selected regions of the substrate to prevent at least one portion of the coating 18 from being applied to those portions of the substrate.

Figure 2:
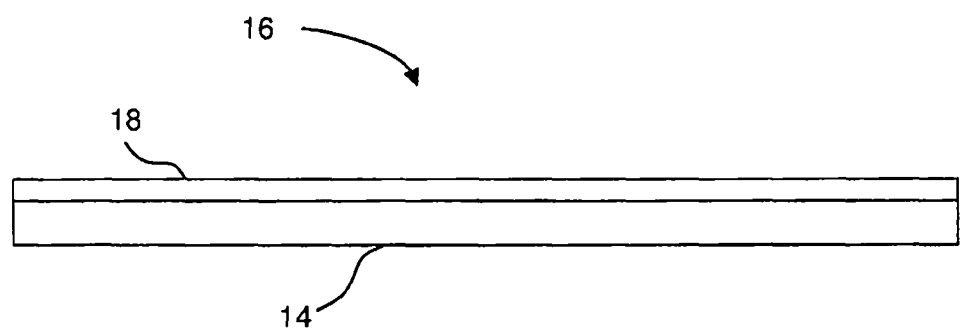
FIG. 2 provides a cross-sectional representation of an apparatus including a protective coating formed from a mixture of two precursors, according to one or more embodiments of the present disclosure.

FIG. 2 provides a cross-sectional representation of an embodiment of an apparatus 16 including a protective coating 18 formed from a mixture of two precursors.

With reference to FIG. 2, an embodiment of an apparatus 16 is illustrated. The protective coating 18 may, as illustrated, include a film, although other configurations of protective structures are also within the scope of this disclosure. The protective coating 18 results from the mixture of two or more dimers prior to application of the copolymer 15, and is configured to provide moisture-resistance. In protective coating 18, the copolymer 15 results from a mixture of parylene C dimer and parylene F dimer in a vaporizer prior to the application of the copolymer 15. The copolymer 15 may be a mixture of parylene C (poly(chloro-p-xylylene)) which may have a superior moisture barrier than other known parylenes and parylene F (sometimes known as parylene AF-4 (poly($\alpha,\alpha,\alpha',\alpha'$-tetrafluoro-p-xylylene)) or parylene VT-4 (poly(tetrafluoro-p-xylylene)), with all four fluorine groups on the aromatic ring) which may include properties that include protection from ultraviolet (UV) light. The coating 18 may provide thermal stability (i.e., resist degradation when exposed to elevated temperatures). The protective coating 18 may be deposited on a substrate 14 or other type of electronic device using machinery and known processes, some of which are disclosed herein.

Figure 11:
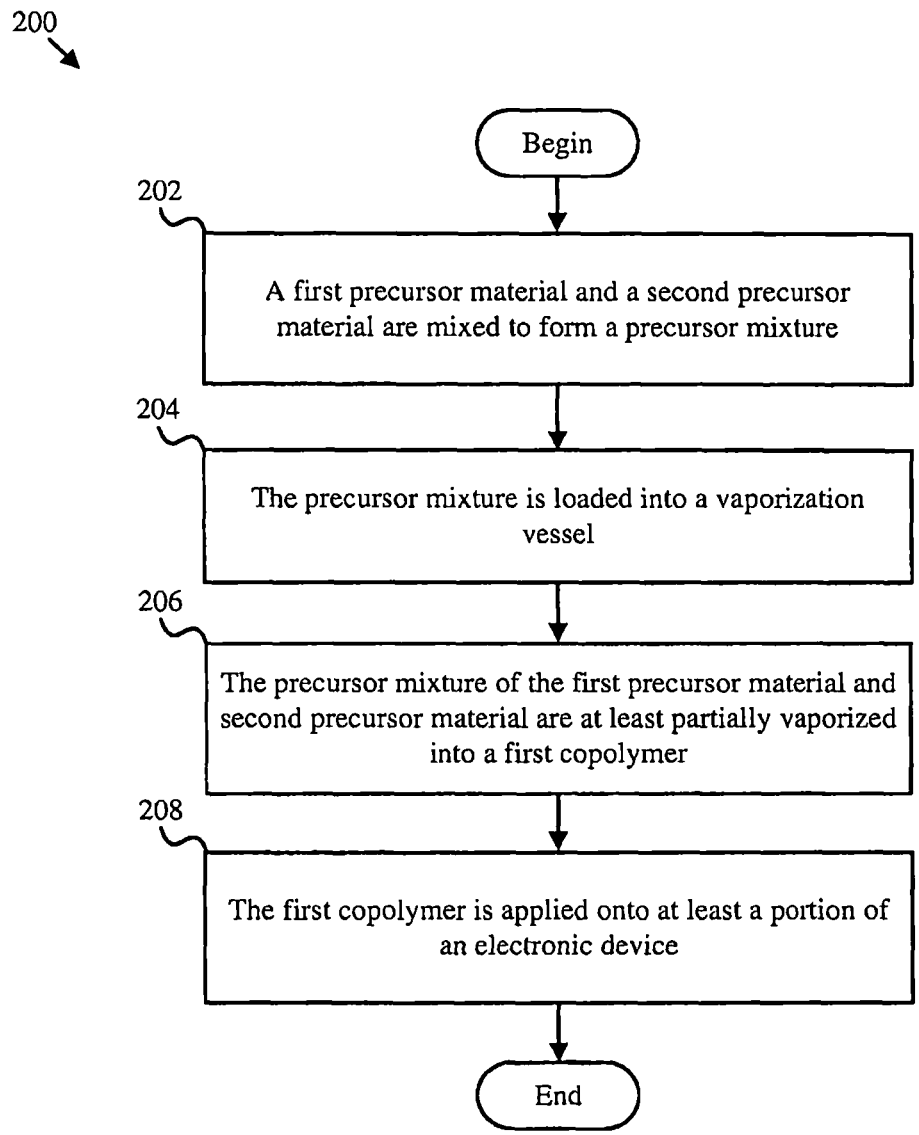
FIG. 11 is a schematic block diagram of a method for depositing a protective coating on an electronic device, according to one or more embodiments of the present disclosure.

Referring to FIG. 11, a method 200 for depositing a protective coating on an electronic device in accordance with the present invention is disclosed. At block 202, the method 200 includes mixing a first precursor material and a second precursor material to form a precursor mixture. At block 204, the precursor mixture is loaded into a vaporization vessel. At block 206, the precursor mixture of the first precursor material and second precursor material is at least partially vaporized into a first copolymer. At block 408, the first copolymer is applied onto at least a portion of an electronic device.

Figure 12:
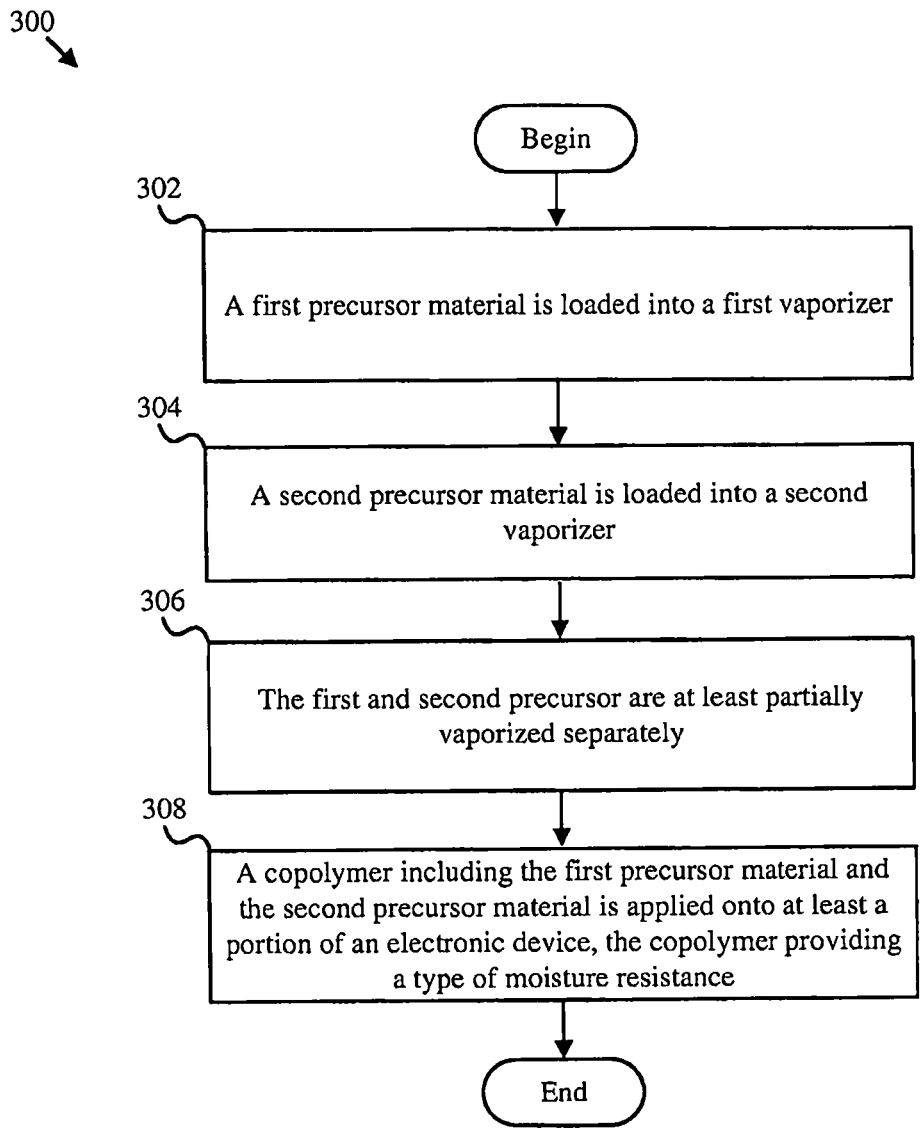
FIG. 12 is a schematic block diagram of a method for imparting an electronic component with moisture resistance, according to one or more embodiments of the present disclosure.

Referring to FIG. 12, a method 300 for imparting an electronic component with moisture resistance in accordance with the present invention is disclosed. At block 302, the method 300 includes loading a first precursor material into a first vaporizer. At block 304, a second precursor material is loaded into a second vaporizer. At block 306, the first and second precursor are at least partially vaporized separately. At block 308, a copolymer including the first precursor material and the second precursor material is applied onto at least a portion of an electronic device, the copolymer providing a type of moisture resistance.

Although the foregoing disclosure provides many specifics, these should not be construed as limiting the scope of any of the ensuing claims. Other embodiments may be devised which do not depart from the scopes of the claims. Features from different embodiments may be employed in combination. The scope of each claim is, therefore, indicated and limited only by its plain language and the full scope of available legal equivalents to its elements.

Reference throughout this specification to features, advantages, or similar language does not imply that all of the features and advantages that may be realized with the subject matter of the present disclosure should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

The present subject matter may be embodied in other specific forms without departing from its spirit or essential characteristics. The described embodiments are to be considered in all respects only as illustrative and not restrictive.

What is claimed:

1. A coating apparatus, comprising:
   a first vaporizer configured to vaporize a first precursor material;
   a second vaporizer configured to vaporize a second precursor material in parallel with the first vaporizor;
   at least one pyrolysis chamber configured to further process vaporized precursor material from one of the first vaporizer or second vaporizer;
   a deposition chamber configured to receive the processed precursor materials;
   a first control valve disposed between the at least one pyrolysis chamber and the deposition chamber to separately regulate an amount of the vaporized first precursor material and an amount the vaporized second precursor material into the deposition chamber;
   a second valve disposed between the at least one pyrolysis chamber and the deposition chamber to separately regulate a speed with which the vaporized first precursor material and the vaporized second precursor material mix;
   a first opening in the deposition chamber, the first opening to receive the vaporized first precursor material; and
   a second opening at a different location in the deposition chamber to receive the vaporized second precursor material.

2. The coating apparatus of claim 1, wherein the at least one pyrolysis chamber comprises a first pyrolysis chamber and a second pyrolysis chamber in parallel with the first pyrolysis chamber.

3. The coating apparatus of claim 2, wherein the coating apparatus further comprises:

a first conduit extending from the first vaporizer to the first pyrolysis chamber; and
   a second conduit extending from the second vaporizer to the second pyrolysis chamber.

4. The coating apparatus of claim 3, wherein the coating apparatus further comprises:
   a third conduit from the first pyrolysis chamber to the deposition chamber; and
   a fourth conduit from the second pyrolysis chamber to the deposition chamber.

5. The coating apparatus of claim 1, wherein the first precursor material comprises parylene C, and the second precursor material comprises parylene F.

6. The coating apparatus of claim 1, wherein the first control valve is further configured to feed the vaporized first precursor material into the deposition chamber at a first rate and to feed the vaporized second precursor material into the deposition chamber at a second rate that is different from the first rate.

7. A coating apparatus, comprising:
   a first vaporizer configured to vaporize a first precursor material comprising parylene C;
   a second vaporizer configured to vaporize a second precursor material comprising parylene F, the second vaporizer in parallel with the first vaporizor;
   a first pyrolysis chamber, the first pyrolysis chamber configured to pyrolyze the vaporized first precursor material;
   a first conduit extending from the first vaporizer to the first pyrolysis chamber, the first conduit configured to transport the vaporized first precursor material to the first pyrolysis chamber;
   a second pyrolysis chamber in parallel with the first pyrolysis chamber, the second pyrolysis chamber configured to pyrolyze the vaporized second precursor material;
   a second conduit extending from the second vaporizer to the second pyrolysis chamber, the second conduit configured to transport vaporized second precursor material to the second pyrolysis chamber;
   a deposition chamber configured to receive the processed precursor materials;
   a third conduit extending from the first pyrolysis chamber and the second pyrolysis chamber to a deposition chamber, the third conduit configured to mix the processed first precursor material and the processed second precursor material prior to entering the deposition chamber; and
   a first control valve disposed relative to the third conduit to separately regulate an amount of vaporized first precursor material and an amount of the vaporized second precursor material toward the deposition chamber; and
   a second valve disposed between the at least one pyrolysis chamber and the deposition chamber to separately regulate a speed with which the vaporized first precursor material and the vaporized second precursor material mix.

* * * * *